United States Patent
Kim et al.

(10) Patent No.: US 8,497,586 B2
(45) Date of Patent: Jul. 30, 2013

(54) PACKAGE MODULE STRUCTURE FOR HIGH POWER DEVICE WITH METAL SUBSTRATE AND METHOD OF MANUFACTURING THE SAME

(75) Inventors: Kyoung-Min Kim, Seoul (KR); Jung-Hyun Kim, Daejeon (KR)

(73) Assignees: Lumens Co., Ltd., Gyeonggi-Do (KR); Wavenics, Inc., Daejeon (KR)

( * ) Notice: Subject to any disclaimer, the term of this patent is extended or adjusted under 35 U.S.C. 154(b) by 0 days.

(21) Appl. No.: 13/520,284

(22) PCT Filed: Feb. 16, 2010

(86) PCT No.: PCT/KR2010/000953
§ 371 (c)(1),
(2), (4) Date: Jul. 2, 2012

(87) PCT Pub. No.: WO2011/081249
PCT Pub. Date: Jul. 7, 2011

(65) Prior Publication Data
US 2013/0020726 A1    Jan. 24, 2013

(30) Foreign Application Priority Data

Jan. 4, 2010  (KR) .......................... 10-2010-0000150

(51) Int. Cl.
*H01L 29/02* (2006.01)
(52) U.S. Cl.
USPC ........... 257/787; 257/678; 257/733; 257/796; 257/E23.001; 257/E21.502
(58) Field of Classification Search
USPC ... 257/678–733, 787–796, E23.001–E23.194
See application file for complete search history.

(56) References Cited

U.S. PATENT DOCUMENTS

| | | | |
|---|---|---|---|
| 2004/0179344 A1* | 9/2004 | Uchida et al. | 361/777 |
| 2005/0051789 A1 | 3/2005 | Negley | |
| 2006/0246617 A1 | 11/2006 | Lee et al. | |

FOREIGN PATENT DOCUMENTS

| | | |
|---|---|---|
| JP | 05-013616 | 1/1993 |
| JP | 06-204355 | 7/1994 |
| JP | 2009-522767 | 6/2009 |
| KR | 100656300 B1 | 5/2006 |
| KR | 1020080035745 A | 4/2008 |
| KR | 10-0834136 | 5/2008 |

* cited by examiner

*Primary Examiner* — Mamadou Diallo
(74) *Attorney, Agent, or Firm* — Stuart H. Mayer; Mayer & Williams P.C.

(57) ABSTRACT

A method of manufacturing a package module structure of a high power device using a metal substrate that can improve reliability by minimizing stress due to a thermal expansion coefficient difference between a metal substrate and a semiconductor device includes: preparing a metal substrate; forming an oxide layer by selectively anodizing the metal substrate; forming a mounting groove for mounting a semiconductor device by etching a portion of the oxide layer; installing a shock-absorbing substrate that is made of a material having a thermal expansion coefficient in a range similar to a material of a semiconductor device to expose the entirety or a portion of a bottom portion of the mounting groove; mounting the semiconductor device in the shock-absorbing substrate exposed to the mounting groove; and electrically connecting an electrode terminal of the semiconductor device and an electrode line formed in an upper surface of the oxide layer.

29 Claims, 6 Drawing Sheets

S10

S20

S30

S50,S60

PACKAGE MODULE STRUCTURE FOR HIGH POWER DEVICE WITH METAL SUBSTRATE AND METHOD OF MANUFACTURING THE SAME

TECHNICAL FIELD

The present invention relates to a package module structure of a high power device using a metal substrate, and a method of manufacturing the same. More particularly, the present invention relates to a package module structure of a high power device using a metal substrate and a method of manufacturing the same that can improve re-liability in a high temperature operation by improving a thermal expansion coefficient difference between the metal substrate and a semiconductor device when packaging the high power semiconductor device in the metal substrate.

BACKGROUND ART

A packaging process in a process of manufacturing a semi-conductor device is a process of improving reliability of a semiconductor device by protecting a semi-conductor chip from the external environment, shaping the semiconductor chip so as to be easily used, and protecting an operation function of the semiconductor chip.

In general, packaging of a semiconductor device is performed using a low temperature co-fired ceramic (LTCC) or a printed circuit board (PCB).

Because a resin substrate used for the semiconductor package has very low thermal conduction characteristics and is deformed at a high temperature, the resin substrate is not generally used when packaging a high power semiconductor device. When using the resin substrate in order to package a high power semiconductor, special processing for enhancing thermal conduction characteristics is necessary and thus the price of the resin substrate is very high.

Further, a ceramic substrate has much better heat resistance than that of the resin substrate, but the ceramic substrate is expensive, and it is difficult and expensive to process.

In order to overcome the drawbacks of the ceramic substrate and the resin substrate, use of a metal material substrate has been suggested. The metal material substrate has merits of being inexpensive, ease of processing, and excellent heat releasing characteristics in which thermal conduction characteristics of the metal material substrate are much better than those of resin or ceramic, and thus has good thermal reliability.

In Korean Patent Nos. 10-0656295, 10-0656300, and 10-0625196, package module technology using a metal substrate is disclosed. The package module technology using a metal substrate is technology regarding completing a module including a semi-conductor chip by forming an oxide film in the metal substrate and providing a package module having high frequency characteristics, semiconductor process compatibility, thermal reliability, and electromagnetic interference (EMI) and electromagnetic compatibility (EMC) stability.

Currently, various application structures and technologies for packaging a metal substrate using an oxide film are being developed, and research thereof is ongoing.

In general, when mounting a high power semiconductor device using a metal having high thermal conduction characteristics, heat generated in the semiconductor device is immediately released through the metal substrate and thus a very effective structure having high reliability and performing stable operation is provided. Particularly, the semiconductor device (for example, a semiconductor chip such as a light emitting diode (LED)) uses Joule heat of a current flowing through an area of a very small size and thus has a very high current density per unit area, whereby to effectively remove some heat is very important to enhance reliability of a final product (when operating at a high temperature, characteristics of the semiconductor device change and the life-span thereof is reduced, and thus a smooth heat-radiating design is a core factor for sustaining performance of a final product).

However, when packaging a high power semiconductor device using the metal substrate, a structure that very effectively releases heat is obtained, compared with a ceramic substrate or a resin substrate, but high stress occurs at an interface between two materials due to a thermal expansion coefficient difference between the metal substrate and the semiconductor device, and this has a harmful influence on reliability (for example, solder joint reliability (SJR)).

That is, the metal substrate has a thermal expansion coefficient of about 2-5 times that of the semiconductor device, and as a general semiconductor device smoothly releases heat, the temperature of the interface does not significantly increase and thus stress does not occur, but in a high power semiconductor device, even if heat is smoothly released, a large amount of heat occurs in the element and thus stress due to the difference in thermal expansion occurs at an interface between the two materials.

For example, the thermal expansion coefficients of Si, GaAs, GaN, which are materials of the semiconductor device, are in a range of about 4-7 ppm/K, while aluminum (Al) and magnesium (Mg), which are materials of the metal substrate, have thermal expansion coefficients of 23 ppm/K and 25 ppm/K, respectively, and thus materials of the semiconductor device and materials of the metal substrate have a very large thermal expansion coefficient difference.

Therefore, if the semiconductor device and the metal substrate are repeatedly in a high temperature state and a low temperature state, the semiconductor device and the metal substrate repeatedly expand and contract by different amounts in proportion to their different thermal expansion coefficients, and because materials enclosing a package in a packaging module expand and contract more than the semiconductor device itself, the expanding and contracting distance increases and thus a crack occurs, whereby SJR is adversely affected and thus reliability of the entire package is deteriorated.

The above information disclosed in this Background section is only for enhancement of understanding of the background of the invention and therefore it may contain information that does not form the prior art that is already known in this country to a person of ordinary skill in the art.

DISCLOSURE OF INVENTION

Technical Problem

The present invention has been made in an effort to provide a package module structure of a high power device using a metal substrate, and a method of manufacturing the same, having advantages of minimizing stress due to a thermal expansion coefficient difference between the metal substrate and a semiconductor device, using a shock-absorbing substrate of a material having a similar thermal expansion coefficient to that a semiconductor device and thereby improving reliability.

Technical Solution

An exemplary embodiment of the present invention provides a package module structure of a high power device using a metal substrate, including: an oxide layer that is formed by selectively anodizing the metal substrate and that has a mounting groove that is formed by etching a portion of the oxide layer; a semiconductor device that is mounted in the mounting groove; and a shock-absorbing substrate that is installed to be exposed at a bottom portion of the mounting groove of the oxide layer to mount the semiconductor device and that is made of a material having a thermal expansion coefficient in a range that is similar to that of a material of the semiconductor device.

A material used for the shock-absorbing substrate may include a metal such as Invar, Silvar, Covar, CuW, and CuMo, or a ceramic, polymer-based, or carbon-based synthetic material having a thermal expansion coefficient in a range of 4-7 ppm/K.

Another embodiment of the present invention provides a method of manufacturing a package module structure of a high power device using a metal material, the method including: preparing a metal substrate; forming an oxide layer by selectively anodizing the metal substrate; forming a mounting groove for mounting a semiconductor device by etching a portion of the oxide layer; installing a shock-absorbing substrate that is made of a material having a thermal expansion coefficient in a range similar to that of a material of a semiconductor device to expose the entirety or a portion of a bottom portion of the mounting groove; mounting the semiconductor device in the shock-absorbing substrate that is exposed by the mounting groove; and electrically connecting an electrode terminal of the semiconductor device and an electrode line that is formed in an upper surface of the oxide layer.

The shock-absorbing substrate may be installed only within the mounting groove, may be installed over the metal oxide layer or the entire bottom surface of the metal substrate, or may be installed to be partially overlapped with the metal oxide layer or the metal substrate.

Advantageous Effects

According to a package module structure of a high power device using a metal substrate and a method of manufacturing the same according to an exemplary embodiment of the present invention, by mounting a semiconductor device in a shock-absorbing substrate that is made of a material having a thermal expansion coefficient of a range that is similar to that of the semiconductor device, even when a high temperature and a low temperature are repeatedly formed in a high power semiconductor device, stress due to a thermal expansion difference can be minimized.

Therefore, SJR can be improved and reliability of an entire package can be secured.

DESCRIPTION OF REFERENCE NUMERALS INDICATING PRIMARY ELEMENTS IN THE DRAWINGS

Figure 1:
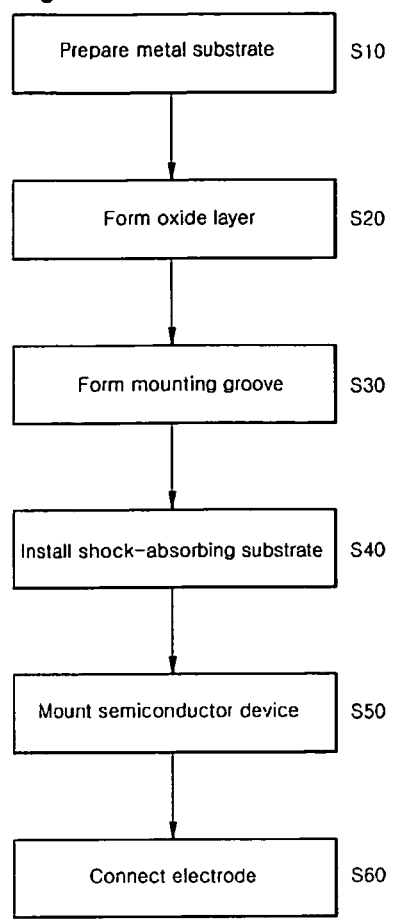
FIG. 1 is a block diagram illustrating a method of manufacturing a package module structure of a high power device using a metal substrate according to a first exemplary embodiment of the present invention.

10—metal substrate,
18—protrusion,
20—oxide layer,
28—oxidation prevention film,
30—mounting groove, 31—air cavity,
34—installation groove,
38—etching prevention film,
40—shock-absorbing substrate,
46—protrusion,
50—semiconductor device,
52—electrode terminal,
60—electrode line,
64—bonding wire,
70—sealing member,
72—barrier rib,
80—external case

MODE FOR THE INVENTION

Exemplary embodiments of a package module structure of a high power device using a metal substrate and a method of manufacturing the same according to the present invention will be described in detail with reference to the accompanying drawings.

Hereinafter, like reference numerals designate like elements throughout the specification.

Figure 2:
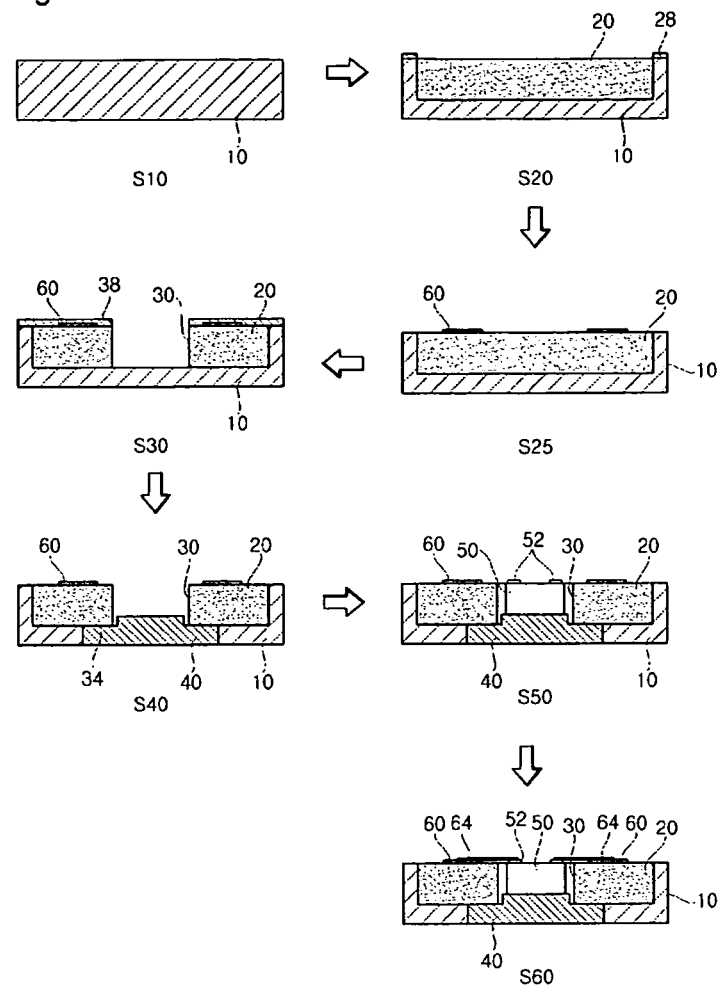
FIG. 2 is a process diagram illustrating a method of manufacturing a package module structure of a high power device using a metal substrate according to a first exemplary embodiment of the present invention.

A method of manufacturing a package module structure of a high power device using a metal substrate according to a first exemplary embodiment of the present invention includes a step of preparing a metal substrate 10 (S10), a step of forming an oxide layer 20 by selectively anodizing the metal substrate 10 (S20), and a step of forming a mounting groove 30 for mounting a semiconductor device 60 by etching a portion of the oxide layer 20 (S30), as shown in FIGS. 1 and 2.

The metal substrate 10 is made of a material such as aluminum (Al), titanium (Ti), and magnesium (Mg), which are metals that can be anodized.

At step S20 of forming the oxide layer 20, anodizing is selectively performed by forming an oxidation prevention film 28 in a predetermined pattern using $Si_3N_4$ or $SiO_2$ in a portion (a portion in which the oxide layer 20 is not to be formed) in which anodizing is not to be performed in the metal substrate 10.

After anodizing is complete, the oxidation prevention film 28 is removed, if it is not needed.

After forming the oxide layer 20, a passive element is formed (S25).

At step S25 of forming a passive element, a passive element such as an inductor, a register, a capacitor, a transmission line, an electrode line for a passive element, and an electrode line 60 for a semiconductor device 50 is formed through a thin film process, a thick film process, a pad forming process for an SMT process, or a hybrid process in which two or three of the above-described processes are combined on the oxide layer 20 of an area except for a portion for forming the mounting groove 30.

When the passive element is formed, as described above, by masking an area in which the passive element is formed using a photoresist before forming the mounting groove 30 by etching a portion of the oxide layer 20, a process of protecting the area can be performed.

In other exemplary embodiments, a step of forming the passive element (S25) and a process of protecting the formed passive element can be performed.

According to an exemplary embodiment of the present invention, as described above, because technology for forming and integrating a passive element for forming a circuit, as needed, in the metal substrate 10 for mounting the semiconductor device 50 can be embodied, a module of a form in which both a passive element and an active element are included within a package of a drop-in form can be manufactured and the module can be inexpensively produced while minimizing its size.

At the step of forming the mounting groove 30 (S30), an etching prevention film 38 is formed using a photoresist, etc., in the oxide layer 20, and then the oxide layer 20 is etched.

After etching is complete, the etching prevention film 38 is removed, if it is not needed.

As etching advances, etching is performed only downward in a vertical direction according to characteristics of the anodized oxide layer 20, and thus a mounting groove 30 having a vertical wall is formed.

A shock-absorbing substrate 40 is formed in a bottom portion of the mounting groove 30 (S40).

In order to form the shock-absorbing substrate 40, by removing a portion of the metal substrate 10 including a portion in which the mounting groove 30 is formed, an installation groove 34 can be formed.

When forming the installation groove 34 in the metal substrate 10 and installing the shock-absorbing substrate 40, as described above, the shock-absorbing substrate 40 is formed in a shape having a height of two steps, a second step portion is inserted into the mounting groove 30, and a first step portion is positioned at the installation groove 34 to contact the bottom surface of the oxide layer 20.

In the shock-absorbing substrate 40, in order to match the height of the mounted semiconductor device 50 and the height of the oxide layer 20 according to the thickness of the oxide layer 20 or the thickness of the mounted semiconductor device 50, a groove can be formed in a portion corresponding to the mounting groove 30. That is, when forming the shock-absorbing substrate 40 in a shape having a height of two steps, a second step portion is not formed to insert into the mounting groove 30, and by forming the mounting groove 30 in a portion corresponding to the mounting groove 30, the bottom surface of the semiconductor device 50 can be formed to be mounted in the shock-absorbing substrate 40 while being positioned lower than the bottom surface of the oxide layer 20.

The shape of the shock-absorbing substrate 40 can be changed according to the thickness of the oxide layer 20 and the thickness of the mounted semiconductor device 50.

The shock-absorbing substrate 40 can be integrally fixed to the metal substrate 10 or the oxide layer 20 using an adhesive such as an epoxy or by soldering.

The shock-absorbing substrate 40 can be integrally fixed to the metal substrate 10 or the oxide layer 20 using a small screw, a screw, etc.

The shock-absorbing substrate 40 is made of a material having a thermal expansion coefficient in a range that is similar to that of the material of the semiconductor device 50 (for example, in a range of 75-200% thereof).

Materials used for the shock-absorbing substrate 40 include a metal such as Invar, Silvar, Covar, CuW, and CuMo, or a ceramic, a polymer-based synthetic material, or a carbon-based synthetic material having a thermal expansion coefficient in a range of 4-7 ppm/K.

Next, the semiconductor device 50 is mounted in a portion of the shock-absorbing substrate 40 that is exposed to the mounting groove 30 (S50).

The semiconductor device 50 is integrally fixed to the shock-absorbing substrate 40 using an adhesives such as an epoxy, or by soldering.

An electrode terminal 52 of the semiconductor device 50 and the electrode line 60 that is formed in an upper surface of the oxide layer 20 are electrically connected (S60).

The electrical connection of the electrode terminal 52 and the electrode line 60 may be performed using a bonding wire 64, and be performed using plating or ribbon bonding.

Next, a package module structure of a high power device using a metal substrate according to an exemplary embodiment of the present invention that is manufactured using the method of manufacturing a package module structure of a high power device using the metal substrate according to the first exemplary embodiment of the present invention will be described.

Figure 3:
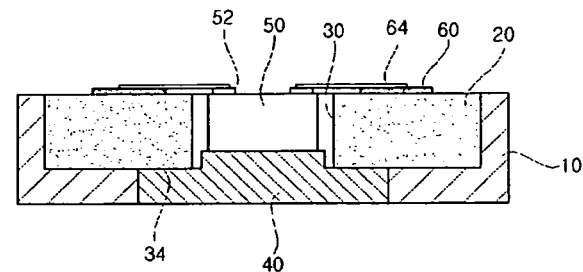
FIG. 3 is a partially enlarged cross-sectional view illustrating a package module structure of a high power device using a metal substrate according to a second exemplary embodiment of the present invention.

A package module structure of a high power device using a metal substrate according to a second exemplary embodiment of the present invention includes an oxide layer 20, a semiconductor device 50, and a shock-absorbing substrate 40, as shown in FIG. 3.

The oxide layer 20 is formed by selectively anodizing the metal substrate 10.

A mounting groove 30 is formed in the oxide layer 20. The mounting groove 30 is formed by etching a portion of the oxide layer 20.

The shock-absorbing substrate 40 is installed to be exposed at a bottom portion of the mounting groove 30 of the oxide layer 20.

The shock-absorbing substrate 40 is made of a material having a thermal expansion coefficient of a range that is similar to that of a material of the semiconductor device 50 (for example, a range of 75-200% thereof).

The shock-absorbing substrate 40 is installed at the installation groove 34 that is formed by removing a portion of the metal substrate 10 that is positioned at a bottom portion of the oxide layer 20 in order to expose the oxide layer 20, and is integrally fixed to the oxide layer 20 using an adhesive.

The semiconductor device 50 is mounted in the mounting groove 30 and is integrally fixed to an upper surface of the shock-absorbing substrate 40 that is exposed to the mounting groove 30 using an adhesive.

The electrode terminal 52 of the semiconductor device 50 and the electrode line 60 that is formed in an upper surface of the oxide layer 20 are electrically connected using the bonding wire 64.

Figure 4:
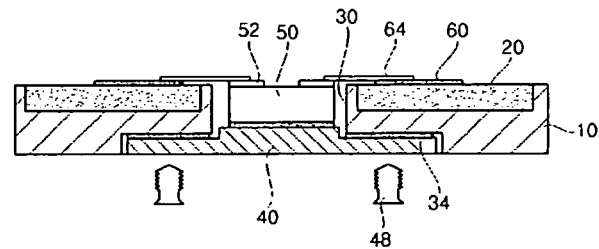
FIG. 4 is a partially enlarged cross-sectional view illustrating a package module structure of a high power device using a metal substrate according to a third exemplary embodiment of the present invention.

In a package module structure of a high power device using a metal substrate according to a third exemplary embodiment of the present invention, the shock-absorbing substrate 40 is installed in the installation groove 34 that is formed by removing a portion of the metal substrate 10, as shown in FIG. 4.

The shock-absorbing substrate 40 may be integrally fixed to the metal substrate 10 using a small screw 48, and may be integrally attached to the metal substrate 10 using an adhesive.

In the third exemplary embodiment, the oxide layer 20 may be partially formed in the metal substrate 10, and the mounting groove 30 may be formed by removing a portion of the metal substrate 10.

A portion of the metal substrate 10 is formed to be exposed to the mounting groove 30, and when the semiconductor device 50 is mounted in the mounting groove 30, heat that is released from the semiconductor device 50 is effectively discharged through the metal substrate 10 having excellent thermal conductivity.

In the third exemplary embodiment, configurations other than the above configuration are formed to be the same as those of the second exemplary embodiment, and therefore a detailed description thereof will be omitted.

Figure 5:
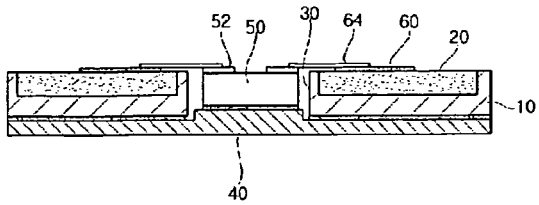
FIG. 5 is a partially enlarged cross-sectional view illustrating a package module structure of a high power device using a metal substrate according to a fourth exemplary embodiment of the present invention.

In a package module structure of a high power device using a metal substrate according to the fourth exemplary embodiment of the present invention, the shock-absorbing substrate 40 is formed over the entire bottom surface of the metal substrate 10, as shown in FIG. 5.

The shock-absorbing substrate 40 is integrally fixed to the metal substrate 10 using an adhesives or a small screw.

According to the fourth exemplary embodiment of the present invention having the above-described configuration, a high power device can be embodied with a high power module of a maximum several hundreds kW or more.

Figure 6:
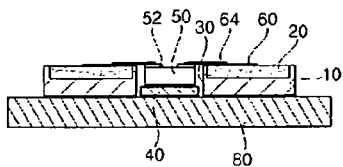
FIG. 6 is a partially enlarged cross-sectional view illustrating a package module structure of a high power device using a metal substrate according to a fifth exemplary embodiment of the present invention.

Further, in a package module structure of a high power device using a metal substrate according to a fifth exemplary embodiment of the present invention, the shock-absorbing substrate 40 is formed in a size that can be inserted into the mounting groove 30, as shown in FIG. 6.

The bottom surface of the shock-absorbing substrate 40 and the bottom surface of the metal substrate 10 may be integrally fixed to an external case 80 or a circuit board using an adhesive.

In the above-described configuration, because an external case or a substrate is used, a separate external metal substrate is unnecessary.

Figure 7:
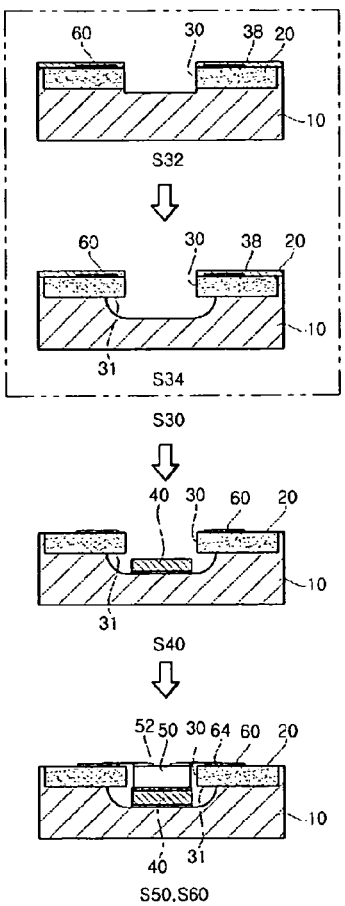
FIG. 7 is a process diagram illustrating a method of manufacturing a package module structure of a high power device using a metal substrate according to a sixth exemplary embodiment of the present invention.

In a method of manufacturing a package module structure of a high power device using a metal substrate according to a sixth exemplary embodiment of the present invention, similar to the first exemplary embodiment, step S30 of forming the mounting groove 30 includes step S32 of forming the mounting groove 30 by primarily etching to penetrate in a height direction at a predetermined position of the oxide layer 20 and step S34 of completing the mounting groove 30 by secondarily etching a portion of the metal substrate 10 that is exposed to a portion in which the mounting groove 30 is primarily formed, as shown in FIG. 7.

When the mounting groove 30 is formed through the above-described process, the metal substrate 10 of a portion of a bottom surface of the oxide layer 20 is etched and thus an air cavity 31 is formed. That is, the anodized oxide layer 20 is etched only downward in a vertical direction, but the metal substrate 10 is isotropically etched and thus the metal substrate 10 is etched to the bottom surface of the oxide layer 20, whereby the air cavity 31 is naturally formed.

An etching liquid used for etching the oxide layer 20 and an etching liquid using for etching the metal substrate 10 are appropriately selected according to necessity (material).

For example, when an aluminum material is used as the metal substrate 10, it is preferable that a chemical material (for example weak hydrochloric acid) that has no chemical influence on a photoresist of the etching prevention film 38 and alumina of the anodized oxide layer 20 is used as an etching liquid for etching the metal substrate 10.

Secondarily, at step S34 of forming the mounting groove 30 in the metal substrate 10, the mounting groove 30 may be formed in the metal substrate 10 using a mechanical method (for example drilling) instead of chemical etching.

When forming a mounting groove in the metal substrate 10 using a mechanical method, an air cavity 31 is not formed in the bottom surface of the oxide layer 20.

When forming of the mounting groove 30 is complete through the above-described process, step S40 of integrally fixing the shock-absorbing substrate 40 to the metal substrate 10 forming the bottom portion of the mounting groove 30 using an adhesive, step S50 of mounting the semiconductor device 50 on the shock-absorbing substrate 40, and step S60 of electrically connecting the electrode terminal 52 and the electrode line 60 are sequentially performed.

When the mounting groove 30 is extended to the metal substrate 10 through the above-described second stage process, the depth of the mounting groove 30 can be adjusted to correspond to the height of the semiconductor device 50 and thus the semi-conductor device 50 can be prevented from protruding higher than the surface of the oxide layer 20 or the metal substrate 10, and the operation of electrically connecting the electrode terminal 52 of the semiconductor device 50 and the electrode line 60 can be performed very easily. Further, the thickness of a final package can be minimized.

Figure 8:
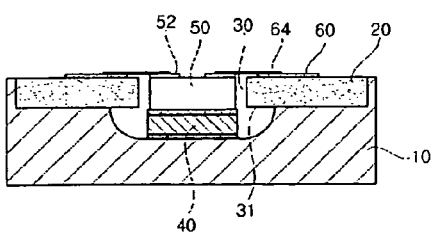
FIG. 8 is a partially enlarged cross-sectional view illustrating a package module structure of a high power device using a metal substrate according to a seventh exemplary embodiment of the present invention.

In a package module structure of a high power device using a metal substrate according to the seventh exemplary embodiment of the present invention, the shock-absorbing substrate 40 is inserted into the mounting groove 30 that is formed by etching the metal substrate 10 and the semiconductor device 50 is mounted on the shock-absorbing substrate 40, as shown in FIG. 8.

The mounting groove 30 includes an air cavity 31 that is formed by removing the metal substrate 10 of a portion of a bottom surface of the oxide layer 20.

Figure 9:
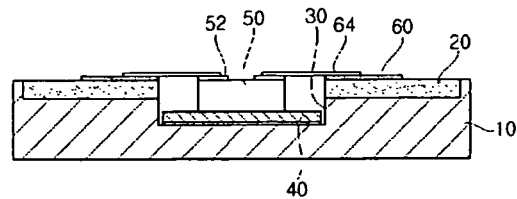
FIG. 9 is a partially enlarged cross-sectional view illustrating a package module structure of a high power device using a metal substrate according to an eighth exemplary embodiment of the present invention.

Further, in a package module structure of a high power device using a metal substrate according to the eighth exemplary embodiment of the present invention, the mounting groove 30 that is formed over the oxide layer 20 and the metal substrate 10 is formed to have the same cross-sectional shape, and the air cavity 31 is not formed in the bottom surface of the oxide layer 20, as shown in FIG. 9.

Figure 10:
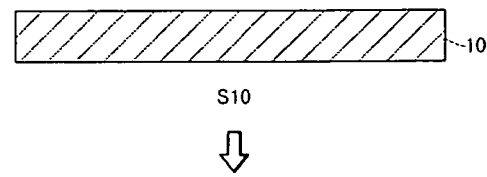
FIG. 10 is a process diagram illustrating a method of manufacturing a package module structure of a high power device using a metal substrate according to a ninth exemplary embodiment of the present invention.
Figure 10:
Figure 10:
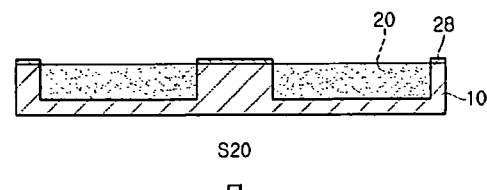
Figure 10:
Figure 10:
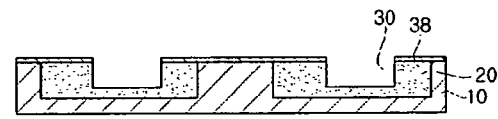
Figure 10:
Figure 10:
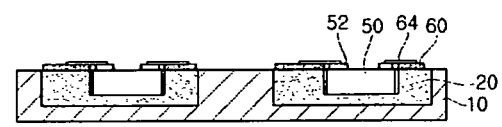

In a method of manufacturing a package module structure of a high power device using a metal substrate according to a ninth exemplary embodiment of the present invention, at step S30 of forming the mounting groove 30 by etching a portion of the anodized oxide layer 20, etching is performed to leave the oxide layer 20 in the bottom portion of the mounting groove 30 instead of etching to penetrate the entire thickness of the oxide layer 20, as shown in FIG. 10.

After forming the mounting groove 30, step S50 of mounting the semiconductor device 50 in the oxide layer 20 within the mounting groove 30 and step S60 of electrically connecting the electrode terminal 52 of the semiconductor device 50 and the electrode line 60 are sequentially performed.

Figure 11:
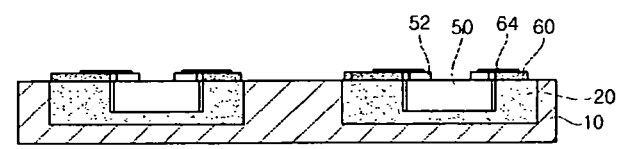
FIG. 11 is a partially enlarged cross-sectional view illustrating a package module structure of a high power device using a metal substrate according to a tenth exemplary embodiment of the present invention.

A package module structure of a high power device using a metal substrate according to a tenth exemplary embodiment of the present invention that is manufactured using the method of the ninth exemplary embodiment is shown in FIG. 11.

A package module structure of a high power device using a metal substrate and a method of manufacturing the same according to the ninth exemplary embodiment and the tenth exemplary embodiment are appropriate when the thermal expansion co-efficient of the oxide layer 20 that is formed by anodizing the metal substrate 10 is similar to the thermal expansion coefficient of the material of the semiconductor device 50, or when the heating value of the semiconductor device 50 is not high. For example, a package module structure of a high power device using a metal substrate and a method of manufacturing the same according to the ninth exemplary embodiment and the tenth exemplary embodiment are appropriate for a high power module of several W (10 W or less).

When packaging is performed, as described above, the thermal expansion coefficient of the remaining oxide layer 20 is little different from that of the mounted semi-conductor device 50, and thus packaging can be performed without using a separate shock-absorbing substrate 40. A general semiconductor device has a small thermal expansion coefficient difference from the oxide layer 20.

Figure 12:
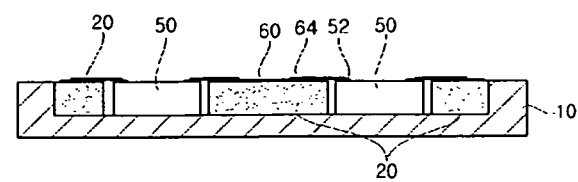
FIG. 12 is a partially enlarged cross-sectional view illustrating a package module structure of a high power device using a metal substrate according to an eleventh exemplary embodiment of the present invention.

In a package module structure of a high power device using a metal substrate according to an eleventh exemplary embodiment of the present invention, the semi-conductor device 50 is directly mounted in a portion of the metal substrate 10 that is exposed by the mounting groove 30, as shown in FIG. 12.

The package module structure of a high power device using a metal substrate according to the eleventh exemplary embodiment is appropriate when the heating value of the semiconductor device 50 is low. For example, the package module structure of a high power device using a metal substrate according to the eleventh exemplary embodiment is appropriate when the output of the semiconductor device 50 is 1 W or less.

The package module structure of a high power device using a metal substrate according to the eleventh exemplary embodiment can be applied when the output of the semiconductor device 50 is 1 W or less, the package module structure of a high power device using a metal substrate and the method of manufacturing the same according to the ninth exemplary embodiment and the tenth exemplary embodiment can be applied when the output of the semiconductor device 50 is several W (for example 10W or less), the package module structure of a high power device using a metal substrate and the method of manufacturing the same according to the fifth exemplary embodiment to the eighth exemplary embodiment can be applied when the output of the semiconductor device 50 is several to several tens of W, and the package module structure of a high power device using a metal substrate and the method of manufacturing the same according to the second exemplary embodiment to the fourth exemplary embodiment can be applied when the output of the semiconductor device 50 is several tens to several hundreds of W.

That is, according to an exemplary embodiment of the present invention, an appropriate structure can be selected according to the output of the semiconductor device 50, and exemplary embodiments of the present invention can be applied to the high power semiconductor device 50 of several tens of W or more.

Next, a method of using a package module structure of a high power device using a metal substrate according to an exemplary embodiment of the present invention having the above-described configuration in a drop-in form of a package will be described.

When a package module structure of a high power device using a metal substrate according to an exemplary embodiment of the present invention is formed in a drop-in form of a package, compatibility can be secured to easily replace a conventional drop-in form of a package, and the manufacturing process of a product can be reduced.

In general, in order to provide a drop-in form of a package, because a manufactured semiconductor product (module) should be packaged again in a drop-in form using a metal material, the cost increases and the size of the packaged final product increases.

Figure 17:
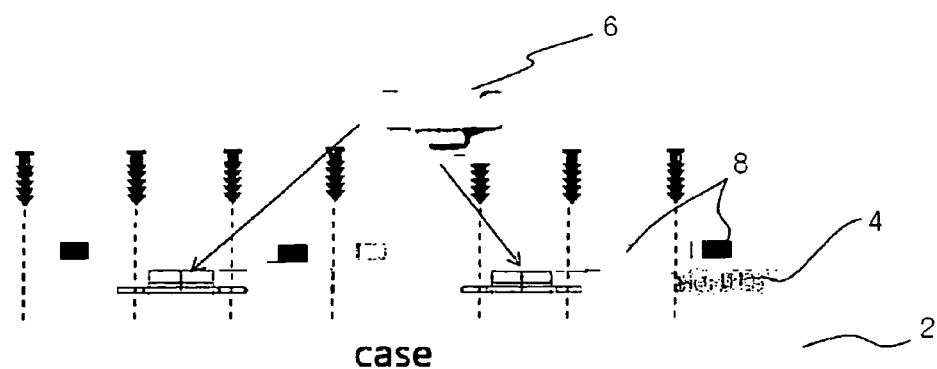
FIG. 17 is a cross-sectional view illustrating an example of a conventional drop-in type of module and a high power module that is assembled with an SMT method.

FIG. 17 illustrates a case of manufacturing a high power module for a general high frequency, and illustrates an electrical module that is formed with an active element of a transistor or an MMIC form and a passive element such as a resistor (R), an inductor (L), a capacitor (C), and a transmission line.

In general, when packaging a high power module, while assembling a drop-in form of an element 6 in which an active element is packaged in an external case 2, a passive element 8 is assembled with an SMT method.

A substrate 4 that is made of a material of a metal PCB and ceramic-based $Al_2O_3$ or AlN can be used.

However, when the substrate 4 is made of a ceramic-based material, the substrate price is high and the mechanical manufacturing method is complicated.

In a conventional method of manufacturing a high power module, the assembling process is complicated, the size of the high power module is very large, and a system designer should consider each unit assembling process.

Further, because an SMT process is used, after assembling, an after-process operation for tuning an individual value through measurement is necessary and the process is very labor intensive.

The above method of manufacturing a high power module is used for assembling a high power RF module of several GHz or less.

Figure 18:
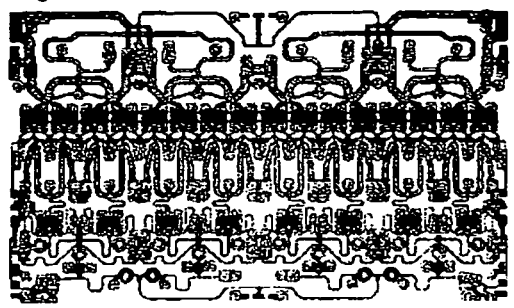
FIG. 18 is a top plan view illustrating an example of a high power module of a conventional MMIC form.

A high power module for use in a several tens of GHz band or several GHz or more generally uses an MMIC form of module, as shown in FIG. 18, and in this case, the above-described conventional manufacturing method is used.

In a conventional MMIC form of a high power module, because a peripheral passive element is included in one IC, the high power module can be conveniently used by a system designer and can be accurately manufactured in a very small size, but the high power module is very expensive.

However, when using a package module structure of a high power device using a metal substrate according to an exemplary embodiment of the present invention, because a circuit is manufactured using the metal substrate, a drop-in form of packaging can be performed on the same substrate, the size of the package module structure can be minimized, the packaging can be cheaply sustained and can be easily used by a user, and as the heat transfer passage is reduced, heat releasing characteristics are greatly improved.

When using a package module structure of a high power device using a metal substrate according to a exemplary embodiment of the present invention, a passive element is formed using a method of a thin film, a thick film, or an SMT, or a hybrid method in a selective oxidized portion of the metal substrate, and an active element is directly mounted in the metal substrate, and thus a module of a form including both a passive element and an active element, as in an MMIC form, can be manufactured within a package.

That is, according to the present invention, because both an active element and a passive element are included within a package, as in an MMIC form, the size of the package module structure can be reduced and the production cost thereof can be reduced.

Further, when an exemplary embodiment according to the present invention is applied to a high power module for a high frequency, the high power module can be applied to all applications from a low frequency band (several GHz) to a high frequency band (several tens of GHz).

According to the present invention, because a metal substrate is used, a drop-in form of integral packaging can be performed, and conventionally, only an active element is packaged within a drop-in form of package, but in the present invention, both an active element and a passive element can be packaged within a drop-in form of a package and a conventional after-process operation (for example, an SMT operation) is unnecessary. That is, an entire system manufacturer performs a conventional form of operation using a drop-in form of a part, but a process of assembling a peripheral circuit is unnecessary.

Further, according to the present invention, because an active element is directly bonded to the metal substrate, compared with a conventional method, heat generated in a semiconductor device is very effectively discharged through the metal substrate.

Hereinafter, a drop-in form of a package based on the fourth exemplary embodiment is described, but the present invention is not limited thereto and can be appropriately applied to all cases of the first exemplary embodiment to the eleventh exemplary embodiment, and thus a drop-in form of a package can be embodied.

Figure 13:
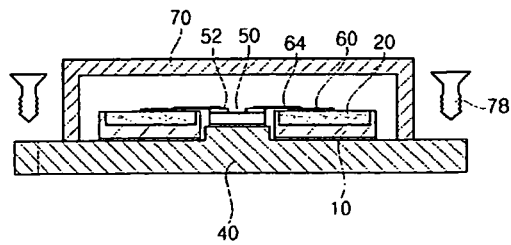
FIG. 13 is a partially enlarged cross-sectional view illustrating a package module structure of a high power device using a metal substrate according to a twelfth exemplary embodiment of the present invention.

In a package module structure of a high power device using a metal substrate according to a twelfth exemplary embodiment of the present invention, similar to the fourth exemplary embodiment, a cup-shaped sealing member 70 is integrally fixed along a corner to a portion of the shock-absorbing substrate 40 that is positioned at the outside of the metal substrate 10, thereby hermetically sealing it, as shown in FIG. 13.

The shock-absorbing substrate 40 is formed in a wider area than that of the metal substrate 10, and can be fixed to a separate circuit board (not shown) in which a control circuit is installed or an external case (not shown) using a fixing screw 78.

Figure 14:
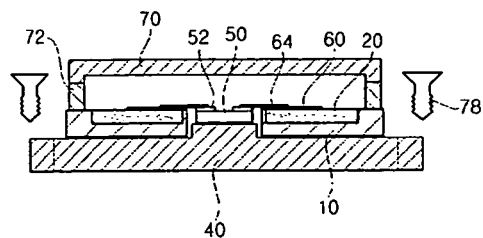
FIG. 14 is a partially enlarged cross-sectional view illustrating a package module structure of a high power device using a metal substrate according to a thirteen exemplary embodiment of the present invention.

In a package module structure of a high power device using a metal substrate according to a thirteenth exemplary embodiment of the present invention, similar to the fourth exemplary embodiment, a barrier rib 72 is installed along an external corner of the metal substrate 10 and the sealing member 70 is integrally installed in the barrier rib 72, thereby hermetically sealing it, as shown in FIG. 14.

The sealing member 70 can be formed in a cup shape or a plate shape.

In the thirteenth exemplary embodiment having the above-described configuration, the entire size can be reduced, compared with the twelfth exemplary embodiment.

Figure 15:
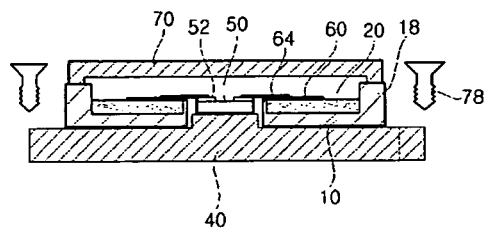
FIG. 15 is a partially enlarged cross-sectional view illustrating a package module structure of a high power device using a metal substrate according to a fourteenth exemplary embodiment of the present invention.

In a package module structure of a high power device using a metal substrate according to a fourteenth exemplary embodiment of the present invention, similar to the fourth exemplary embodiment, a protrusion 18 is formed to protrude upward from an external corner portion of the metal substrate 10, and the sealing member 70 is integrally installed in the protrusion 18, thereby hermetically sealing it, as shown in FIG. 15.

The height of the protrusion 18 is somewhat higher than the height of the bonding wire 64 or the electrode line 60, and when the sealing member 70 is installed to have a ceiling of a height that is similar to the height, the entire height of the package module can be formed low.

Figure 16:
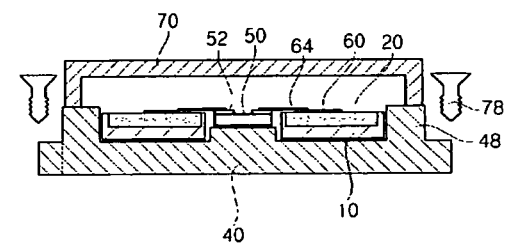
FIG. 16 is a partially enlarged cross-sectional view illustrating a package module structure of a high power device using a metal substrate according to a fifteenth exemplary embodiment of the present invention.

In a package module structure of a higher power device using a metal substrate according to a fifteenth exemplary embodiment of the present invention, similar to the fourth exemplary embodiment, a protrusion 46 is formed by protruding a portion of the shock-absorbing substrate 40 that is positioned at the outside of the metal substrate 10 and a sealing member 70 is integrally installed in the protrusion 46, thereby hermetically sealing it, as described in FIG. 16.

The first exemplary embodiment to the fifteenth exemplary embodiment according to the present invention can be appropriately combined, as needed.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A method of manufacturing a package module structure of a high power device using a metal substrate, the method comprising:
preparing a metal substrate;
forming an oxide layer by selectively anodizing the metal substrate;

forming a mounting groove for mounting a semiconductor device by etching a portion of the oxide layer;

installing a shock-absorbing substrate that is made of a material having a thermal expansion coefficient in a range of 75-200% that of a material of a semi-conductor device to expose the entirety or a portion of a bottom portion of the mounting groove;

mounting the semiconductor device in the shock-absorbing substrate that is exposed to the mounting groove; and electrically connecting an electrode terminal of the semiconductor device and an electrode line that is formed in an upper surface of the oxide layer.

2. The method of claim 1, wherein a material used for the shock-absorbing substrate is selected from Invar, Silvar, Covar, CuW, CuMo, ceramic, a polymer-based material, and a carbon-based synthetic material.

3. The method of claim 1, wherein the installing of a shock-absorbing substrate comprises forming the shock-absorbing substrate in a size that can be inserted into the mounting groove and installing the shock-absorbing substrate.

4. The method of claim 1, wherein the forming of a mounting groove comprises primarily etching the oxide layer to penetrate in a height direction at a predetermined position of the oxide layer, and completing the mounting groove by secondarily removing a portion of the metal substrate that is exposed at the position where the mounting groove is primarily formed.

5. The method of claim 4, wherein the secondarily removing of a portion of the metal substrate comprises removing the metal substrate using chemical etching or a mechanical method.

6. The method of claim 1, wherein the forming of a mounting groove for mounting a semiconductor device comprises etching to leave the oxide layer in a bottom portion of the mounting groove instead of etching to penetrate through the entire thickness of the oxide layer.

7. The method of claim 6, wherein the mounting groove is formed by etching to leave the oxide layer and then the semiconductor device is mounted in the oxide layer instead of installing the shock-absorbing substrate within the mounting groove.

8. The method of claim 1, wherein the forming of a mounting groove for mounting the semiconductor device comprises removing a portion of the metal substrate instead of etching a portion of the oxide layer.

9. The method of claim 1, wherein the installing of a shock-absorbing substrate comprises forming an installation groove by removing a portion of the metal substrate to penetrate through a bottom surface of the mounting groove in order to install the shock-absorbing substrate.

10. The method of claim 9, wherein the shock-absorbing substrate is formed in a shape having a height of two steps, wherein a second step portion is inserted into the mounting groove and a first step portion is positioned at the installation groove.

11. The method of claim 10, wherein the installing of a shock-absorbing substrate comprises entirely removing a bottom surface of the metal substrate to correspond to a depth of the mounting groove so that a bottom surface of the mounting groove may be penetrated instead of forming an installation groove, and by forming the first step portion of the shock-absorbing substrate more widely than an area of the metal substrate.

12. The method of claim 11, wherein the electrode terminal of the semiconductor device and the electrode line are electrically connected, and then a cup-shaped sealing member is integrally fixed along a corner of the shock-absorbing substrate to a portion of the shock-absorbing substrate that is positioned at the outside of the metal substrate to perform hermitic sealing.

13. The method of claim 11, wherein the electrode terminal of the semiconductor device and the electrode line are electrically connected, and then a cup-shaped or plate-shaped sealing member is integrally installed at a protrusion that is formed by protruding a portion of the shock-absorbing substrate that is positioned at the outside of the metal substrate to perform hermitic sealing.

14. The method of claim 1, wherein the electrode terminal of the semiconductor device and the electrode line are electrically connected, then a barrier rib is installed along an external corner of the metal substrate, and a cup-shaped or plate-shaped sealing member is integrally installed in a barrier rib to perform hermitic sealing.

15. The method of claim 1, wherein the electrode terminal of the semiconductor device and the electrode line are electrically connected and then a cup-shaped or plate-shaped sealing member is integrally installed in a protrusion that is formed by protruding an external corner of the metal substrate upward to perform hermitic sealing.

16. A package module structure of a high power device using a metal substrate, comprising:

an oxide layer that is formed by selectively anodizing the metal substrate and that has a mounting groove that is formed by etching a portion of the oxide layer;

a semiconductor device that is mounted in the mounting groove; and a shock-absorbing substrate that is installed to be exposed in a bottom portion of the mounting groove of the oxide layer to mount the semiconductor device and that is made of a material having a thermal expansion coefficient in a range of 75-200% that of a material of the semiconductor device.

17. The package module structure of claim 16, wherein the shock-absorbing substrate is made of a material that is selected from Invar, Silvar, Covar, CuW, CuMo, ceramic, a polymer-based material, and a carbon-based synthetic material.

18. The package module structure of claim 16, wherein the mounting groove is formed by primarily etching the oxide layer to penetrate in a height direction at a predetermined position of the oxide layer and by secondarily removing a portion of the metal substrate that is exposed to a portion in which the oxide layer is etched.

19. The package module structure of claim 18, wherein the mounting groove that is formed in a portion of the metal substrate is formed up to a bottom surface of the oxide layer to have an air cavity.

20. The package module structure of claim 18, wherein the shock-absorbing substrate is installed by inserting it into the mounting groove that is formed by removing a portion of the metal substrate.

21. The package module structure of claim 16, wherein the oxide layer remaining at the bottom of the mounting groove by not forming the mounting groove through etching to the bottom of the oxide layer is used as the shock-absorbing substrate instead of separately installing the shock-absorbing substrate.

22. The package module structure of claim 16, wherein the semiconductor device is directly mounted in the metal substrate that is exposed to the mounting groove instead of separately installing the shock-absorbing substrate.

23. The package module structure of claim 16, wherein the shock-absorbing substrate is installed at an installation groove that is formed by removing a portion of the metal substrate that is positioned at a bottom portion of the oxide layer in order to expose the oxide layer.

24. The package module structure of claim 23, wherein the shock-absorbing substrate is formed in a shape having a height of two steps, wherein a second step portion is inserted into the mounting groove and a first step portion is positioned at the installation groove.

25. The package module structure of claim 24, wherein the shock-absorbing substrate is formed to position the first step portion over the entire bottom surface of the metal substrate.

26. The package module structure of claim 25, further comprising a cup-shaped sealing member that is integrally fixed to perform hermitic sealing along a corner in a portion of the shock-absorbing substrate that is positioned at the outside of the metal substrate.

27. The package module structure of claim 25, further comprising:
   a protrusion that is formed to protrude at a portion of the shock-absorbing substrate that is positioned at the outside of the metal substrate; and
   a cup-shaped or plate-shaped sealing member that is integrally fixed to perform hermitic sealing at the protrusion of the shock-absorbing substrate.

28. The package module structure of claim 16, further comprising:
   a protrusion that is formed by upwardly protruding an external corner portion of the metal substrate; and
   a cup-shaped or plate-shaped sealing member that is integrally fixed to perform hermitic sealing in the protrusion of the metal substrate.

29. The package module structure of claim 16, further comprising:
   a barrier rib that is installed along an external corner portion of the metal substrate; and
   a cup-shaped or plate-shaped sealing member that is integrally fixed to perform hermitic sealing in the barrier rib.

* * * * *